(12) United States Patent  (10) Patent No.: US 8,125,071 B2
Kuan  (45) Date of Patent: Feb. 28, 2012

(54) PACKAGE STRUCTURE UTILIZING HIGH AND LOW SIDE DRIVERS ON SEPARATE DICE

(75) Inventor: Kan-Sheng Kuan, Hsinchu County (TW)

(73) Assignee: inergy Technology Inc., Hsinchu County (TW)

( * ) Notice: Subject to any disclaimer, the term of this patent is extended or adjusted under 35 U.S.C. 154(b) by 0 days.

(21) Appl. No.: 12/416,938

(22) Filed: Apr. 2, 2009

(65) Prior Publication Data

US 2010/0052140 A1    Mar. 4, 2010

(30) Foreign Application Priority Data

Sep. 3, 2008   (TW) ............................... 97215893 U (51) Int. Cl.
*H01L 23/495* (2006.01)

(52) U.S. Cl. ........ 257/690; 257/666; 257/685; 257/691; 257/692; 257/723; 257/784

(58) Field of Classification Search .................. 257/666, 257/685, 686, 672, 676, 690, 691, 692, 693, 257/697, 777, 723, 784, E25.015, E25.016, 257/E25.029, E25.03, E23.031
See application file for complete search history.

(56) References Cited

U.S. PATENT DOCUMENTS

| 5,626,619 | A  | * | 5/1997  | Jacobson et al. | ................. 607/5 |
| 5,814,884 | A  | * | 9/1998  | Davis et al.    | .................. 257/723 |
| 6,458,625 | B2 | * | 10/2002 | Akram           | ..................... 438/111 |
| 2005/0224924 | A1 | * | 10/2005 | Koh et al.   | ..................... 257/666 |
| 2005/0269674 | A1 | * | 12/2005 | Kawakita et al. | ............. 257/666 |
| 2009/0051393 | A1 | * | 2/2009  | Kamenicky et al. | .......... 327/108 |
| 2009/0184760 | A1 | * | 7/2009  | Hauenstein | ................... 327/594 |

* cited by examiner

Primary Examiner — Matthew Reames
Assistant Examiner — Ermias Woldegeorgis
(74) Attorney, Agent, or Firm — CKC & Partners Co., Ltd.

(57) ABSTRACT

In the specification and drawing a package structure is described and shown with a first die including a high side driver and at least a first bonding pad, a second die including a low side driver, a high withstand voltage device, a controller coupled with the low side driver and the high withstand voltage device and at least a second bonding pad, and at least one conducting wire, in which the high side driver is coupled through the first bonding pad, the conducting wire, the second bonding pad and the high withstand voltage device to the controller.

8 Claims, 8 Drawing Sheets

PACKAGE STRUCTURE UTILIZING HIGH AND LOW SIDE DRIVERS ON SEPARATE DICE

RELATED APPLICATIONS

This application claims priority to Taiwan Application Serial Number 97215893, filed Sep. 3, 2008, which is herein incorporated by reference.

BACKGROUND

1. Field of Invention

The present invention relates to a structure. More particularly, the present invention relates to a package structure.

2. Description of Related Art

In power converter, included ballast and motor driver, half bridge switch is often involved. Half bridge switch is a series of two switches (low side and high side switches) connected between positive and negative pole of dc electrical bus. The two switches action complementary so the node in between the switches is either connected to positive pole or negative pole of dc electrical bus.

For those switches, Transistor, MOSFET or IGBT are often used. They are three-terminal devices. Connecting and breaking of the switch is between two of those terminals. The control for connecting or breaking (on/off signal) is applied between two terminals, so one of those terminals should be in common. The common terminal is emitter, source or emitter for transistor, MOSFET or IGBT, respectively. The controlling terminal is base, gate or gate for the respective device. The last terminal is collector, drain or collector, respectively.

In most applications, the common terminal of lower switch is coupled to negative pole, and so is the controller's ground, so its on/off signal may be direct applied to controlling terminal. However, for high side switch, whose common terminal is swinging between positive and negative pole of dc electrical bus, so its control signal need to be float, moving relative with its common terminal. The conventional method uses pulse transformer or photo-couple. For performance and cost, recently developed semiconductor high side driver is becoming popular.

SUMMARY

It is therefore an aspect of the present invention to provide a package structure, in which a high side driver and a low side driver are integrated.

In accordance with an embodiment of the present invention, the package structure comprises a first lead frame, a second lead frame, a first die, a second die and at least one conducting wire. The second lead frame is disposed apart from the first lead frame. The first die is disposed on the first lead frame, where the first die comprises a high side driver. The second die is disposed on the second lead frame, where the second die comprises a low side driver, a high withstand voltage device and a controller coupled with the low side driver and the high withstand voltage device. The conducting wire coupled with the first die and the second die.

It is another aspect of the present invention to provide another package structure, in which a high side driver and a low side driver are integrated.

In accordance with another embodiment of the present invention, the package structure comprises a lead frame, a first die, a second die and at least one conducting wire. The first die comprises a high side driver; the second die comprises a low side driver, a high withstand voltage device and a controller coupled with the low side driver and the high withstand voltage device, where the second die is disposed apart from the first die. The lead frame is disposed under the first die and the second die. The conducting wire coupled with the first die and the second die.

It is to be understood that both the foregoing general description and the following detailed description are by examples, and are intended to provide further explanation of the invention as claimed.

BRIEF DESCRIPTION OF THE DRAWINGS

For a more complete understanding of the present invention, and the advantages thereof, reference is now made to the following descriptions taken in conjunction with the accompanying drawing, in which.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

The semiconductor high side driver may be implemented using discrete semiconductor components, but it takes space, complicated and risk. With the advance of high voltage semiconductor technology, high side driver as single device is achievable. Inside, it includes two sub-circuits: controller with low side driver and high side driver. The circuit of high side driver is floating. In practice, the isolation with respect to ground is accomplished using high voltage silicon or silicon on insulator technologies; however, the former is hard on the high voltage endurance, and the later is hard on manufacturing cost. In one or more aspects, the present invention is directed to a multi-dice structure so a very high voltage capability is achievable cost effectively.

Figure 1:
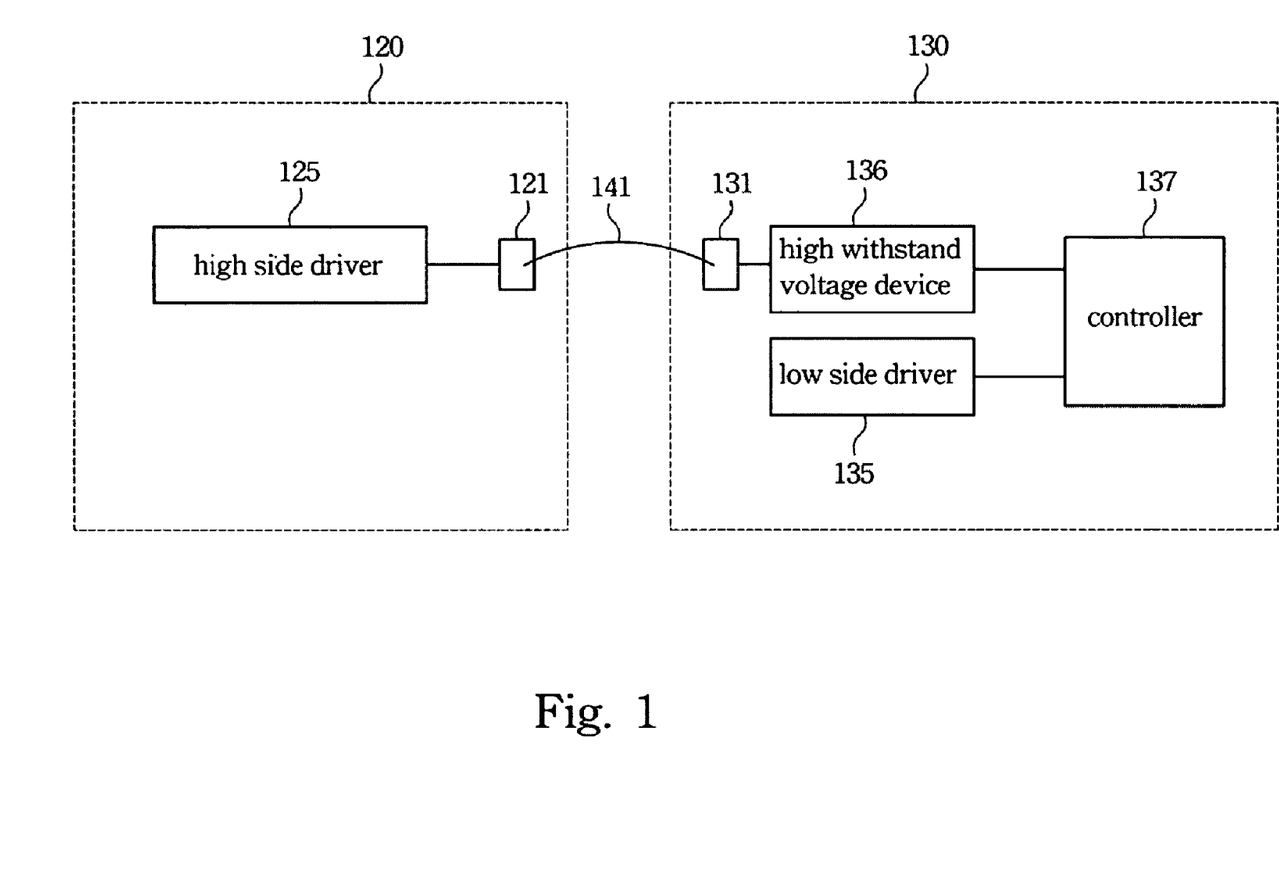
FIG. 1 is a schematic diagram of at least a portion of a package structure according to one or more aspects of the present invention.

Please refer to FIG. 1. FIG. 1 is a schematic diagram of at least a portion of a package structure according to one or more aspects of the present invention. In FIG. 1, the first die 120 comprises a high side driver 125, and a second die 130 comprises a low side driver 135, a high withstand voltage device 136 and a controller 137; the controller 137 is coupled with the low side driver 135 and the high withstand voltage device 136. The high withstand voltage device 136 comprises at least one of a high withstand voltage transistor and a high voltage capacitor.

It should be noted that the first die 120 is disposed apart from the second die 130; at least one the conducting wire 141 is coupled with the first die 120 and the second die 130. Furthermore, one end of the conducting wire 141 is electrically connected to the bonding pad 121 of the first die 120, and the other end of the conducting wire 141 is electrically connected to the bonding pad 131 of the second die 130

Figure 2:
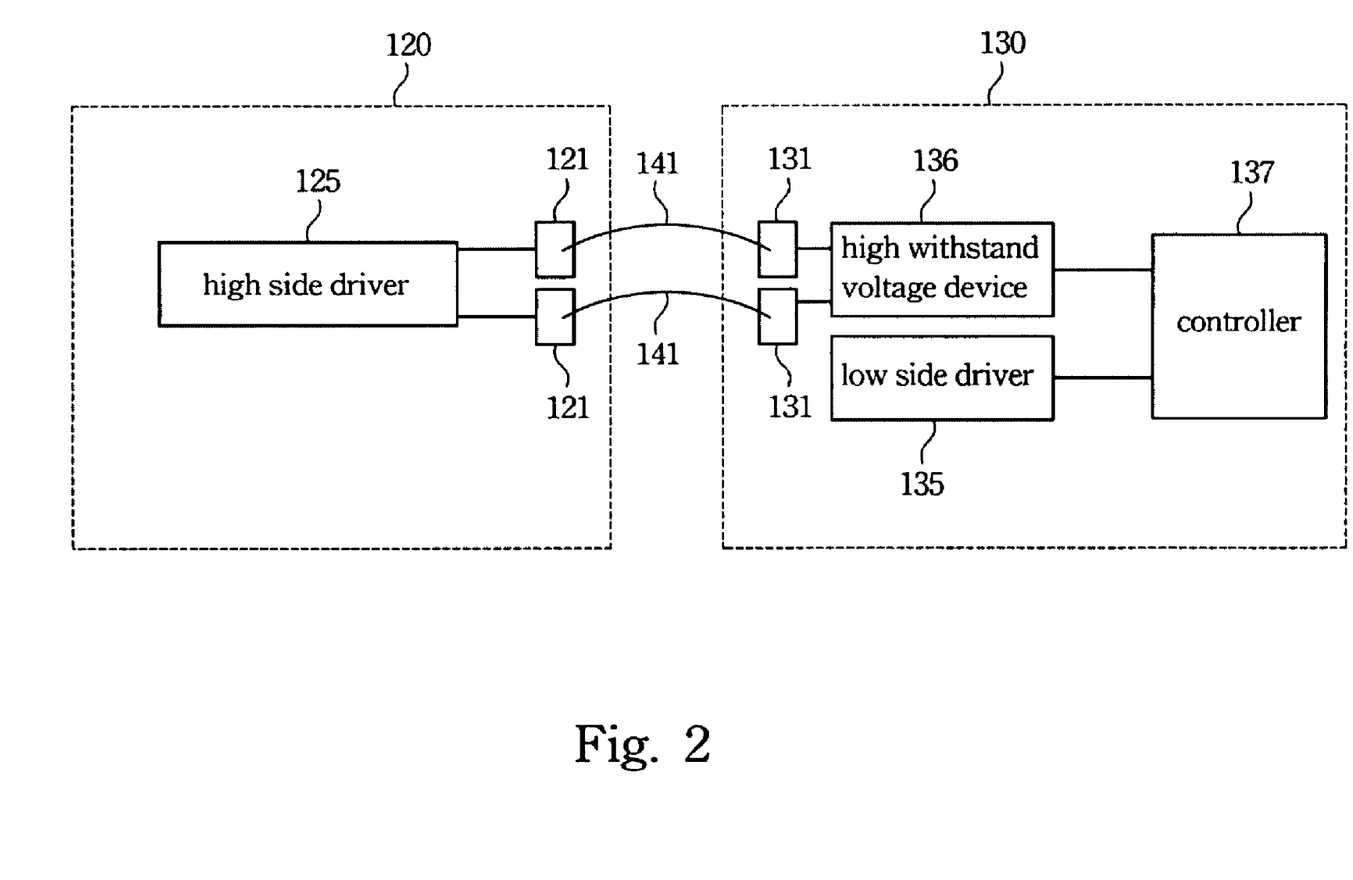
FIG. 2 is another schematic diagram of at least a portion of a package structure according to one or more aspects of the present invention.

Please refer to FIG. 2. FIG. 2 is another schematic diagram of at least a portion of a package structure according to one or more aspects of the present invention. In FIG. 2, the first die 120 comprises a high side driver 125, and a second die 130 comprises a low side driver 135, a high withstand voltage device 136 and a controller 137; the controller 137 is coupled with the low side driver 135 and the high withstand voltage device 136. The high withstand voltage device 136 comprises at least one of a high withstand voltage transistor and a high voltage capacitor.

It should be noted that the first die 120 is disposed apart from the second die 130; two conducting wires 141 are coupled with the first die 120 and the second die 130. Furthermore, one end of each of the conducting wires 141 is electrically connected to the bonding pad 121 of the first die 120, and the other end of each of the conducting wires 141 is electrically connected to the bonding pad 131 of the second die 130.

Figure 3:
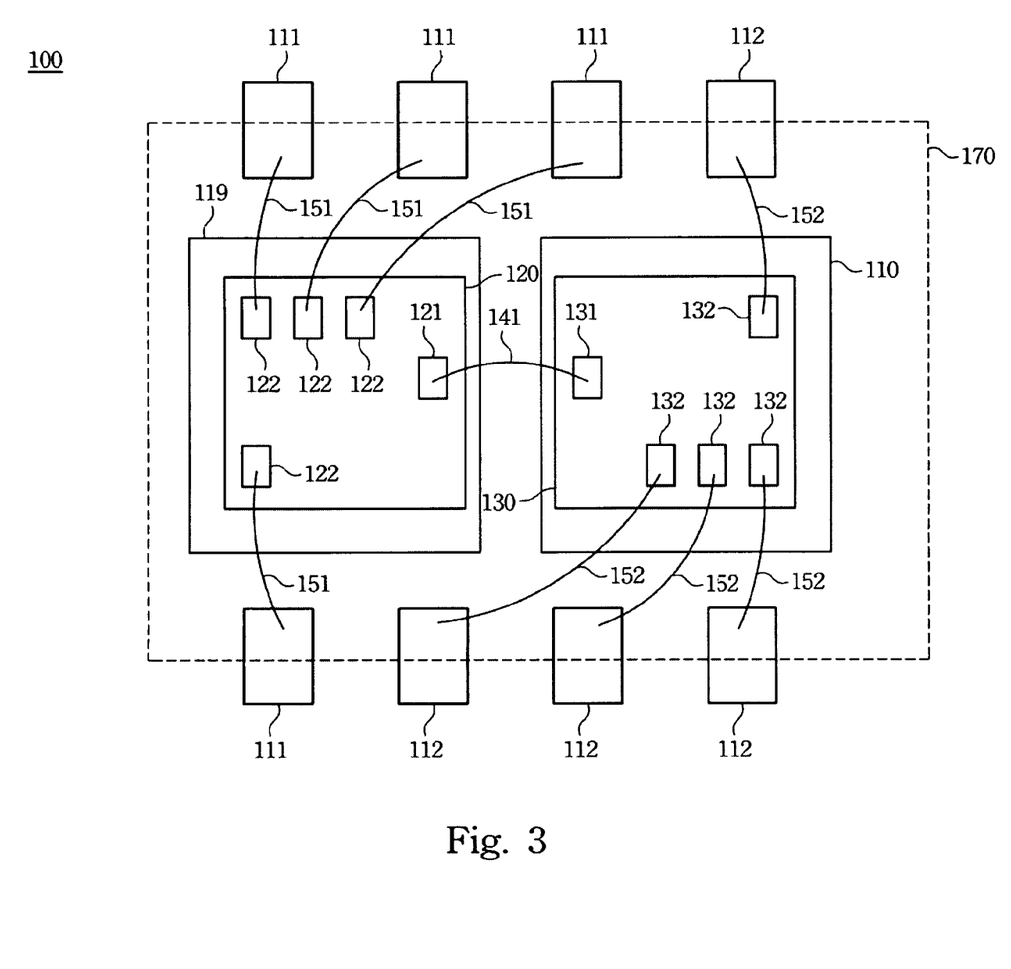
FIG. 3 is a schematic diagram of a package structure according to a first embodiment of the present invention.

For a more complete understanding of the present invention, please refer to FIG. 3. FIG. 3 is a schematic diagram of a package structure 100 according to a first embodiment of the present invention. In FIG. 3, the package structure 100 comprises a first die 120, a second die 130, a first lead frame 119, a second lead frame 110 and at least one the conducting wire 141. The formation of the first die 120 and the second die 130 are shown in FIG. 1 and, thus, are not repeated herein. The first die 120 is disposed on the first lead frame 119, and the second die 130 is disposed on the second lead frame 110; the first lead frame 119 is disposed apart from the second lead frame 110; the conducting wire 141 is coupled with the first die 120 and the second die 130. Furthermore, one end of the conducting wire 141 is electrically connected to the bonding pad 121 of the first die 120, and the other end of the conducting wire 141 is electrically connected to the bonding pad 131 of the second die 130.

In FIG. 3, the package structure 100 further comprises a first set of pins 111, a second set of pins 112, a first set of conducting wires 151 and a second set of conducting wires 152. The first set of pins 111 is disposed alongside the first lead frame 119; the second set of pins 112 is disposed alongside the second lead frame 110. The first set of conducting wires 151 is coupled with the first die 120 and the first set of pins 111; the second set of conducting wires 152 is coupled with the second die 130 and the second set of pins 112.

In FIG. 3, the first die 120 comprises bonding pads 122, and the second die 130 comprises bonding pads 132. Furthermore, one end of each of the first set of conducting wires 151 is electrically connected to the bonding pads 122 of the first die 120, and the other end of each of the first set of conducting wires 151 is electrically connected to the first set of pins 111; one end of each of the second set of conducting wires 152 is electrically connected to the bonding pads 132 of the second die 130, and the other end of each of the second set of conducting wires 152 is electrically connected to the second set of pins 112. Moreover, a dotted line shows the region of the sealing compound 170.

Figure 4:
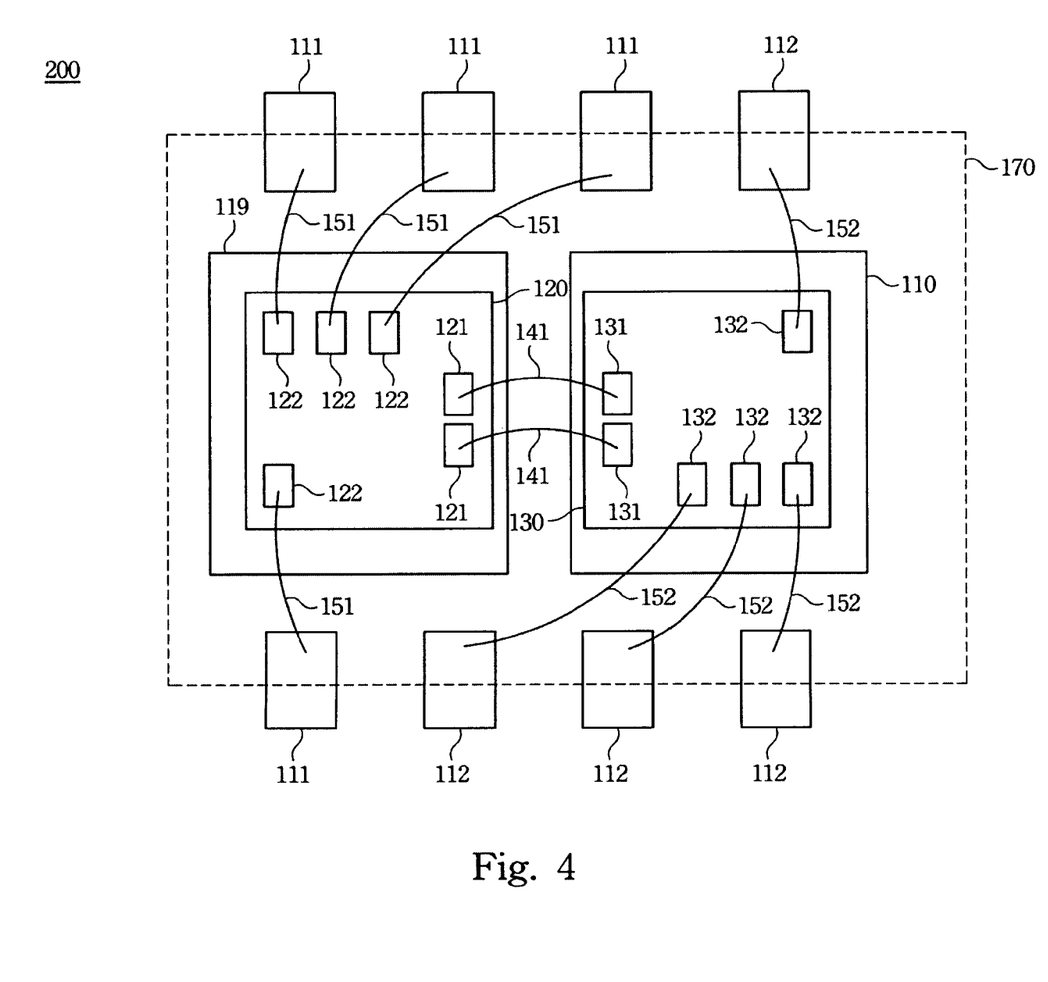
FIG. 4 is a schematic diagram of a package structure according to a second embodiment of the present invention.

Please refer to FIG. 4. FIG. 4 is a schematic diagram of a package structure 200 according to a second embodiment of the present invention. The package structure 200 is essentially the same as the package structure 100, except that another conducting wire 141 is coupled with the first die 120 and the second die 130 is added.

Figure 5:
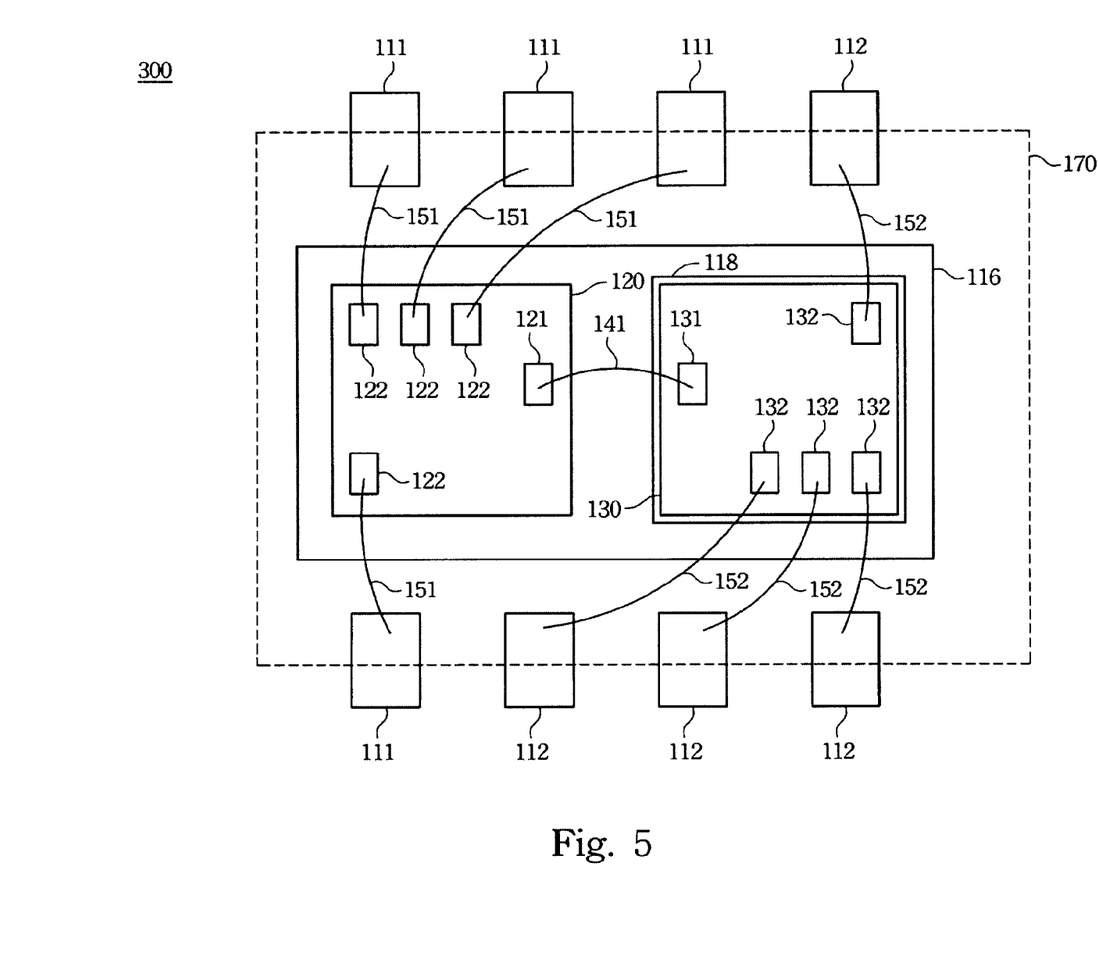
FIG. 5 is a schematic diagram of a package structure according to a third embodiment of the present invention.

Please refer to FIG. 5. FIG. 5 is a schematic diagram of a package structure 300 according to a third embodiment of the present invention. In FIG. 5, the package structure 300 comprises a first die 120, a second die 130, a lead frame 116, an insulating layer 118 and at least one the conducting wire 141. The formation of the first die 120 and the second die 130 are shown in FIG. 1 and, thus, are not repeated herein. The first die 120 is disposed apart from the second die 130; the lead frame 116 is disposed under the first die 120 and the second die 130. The insulating layer 118 is disposed between the lead frame 116 and the second die 130.

The insulating layer 118 can electrically isolate the first die 120 and the second die 130 in order to prevent the first die 120 and the second die 130 interfere with each other. In processing, the insulating layer 118 is formed on the bottom of the second die 130; alternatively, the insulating layer 118 is formed on the surface of the lead frame 110.

In FIG. 5, the package structure 300 further comprises a first set of pins 111, a second set of pins 112, a first set of conducting wires 151 and a second set of conducting wires 152. The first set of pins 111 and the second set of pins 112 are disposed alongside the lead frame 116. The first set of conducting wires 151 is coupled with the first die 120 and the first set of pins 111; the second set of conducting wires 152 is coupled with the second die 130 and the second set of pins 112.

In FIG. 5, the first die 120 comprises bonding pads 122, and the second die 130 comprises bonding pads 132. Furthermore, one end of each of the first set of conducting wires 151 is electrically connected to the bonding pads 122 of the first die 120, and the other end of each of the first set of conducting wires 151 is electrically connected to the first set of pins 111; one end of each of the second set of conducting wires 152 is electrically connected to the bonding pads 132 of the second die 130, and the other end of each of the second set of conducting wires 152 is electrically connected to the second set of pins 112. Moreover, a dotted line shows the region of the sealing compound 170.

Figure 6:
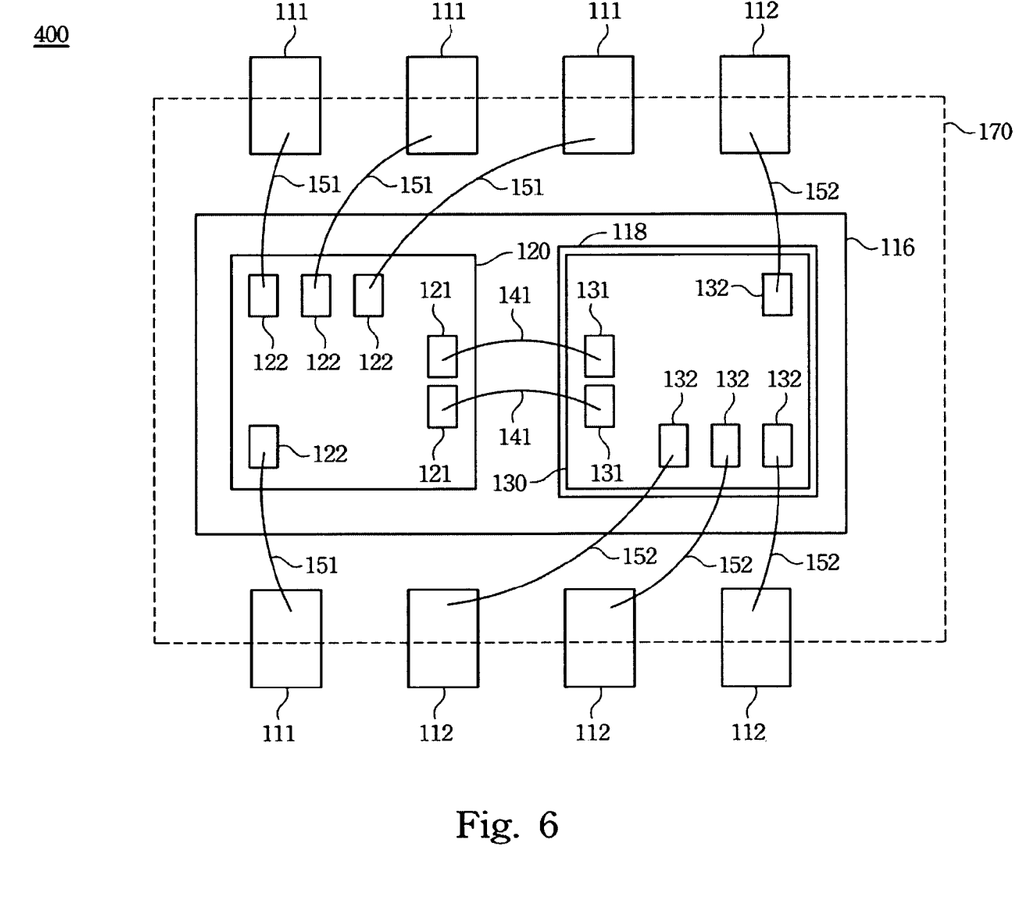
FIG. 6 is a schematic diagram of a package structure according to a fourth embodiment of the present invention.

Please refer to FIG. 6. FIG. 6 is a schematic diagram of a package structure 400 according to a fourth embodiment of the present invention. The package structure 400 is essentially the same as the package structure 300, except that another conducting wire 141 is coupled with the first die 120 and the second die 130 is added.

Figure 7:
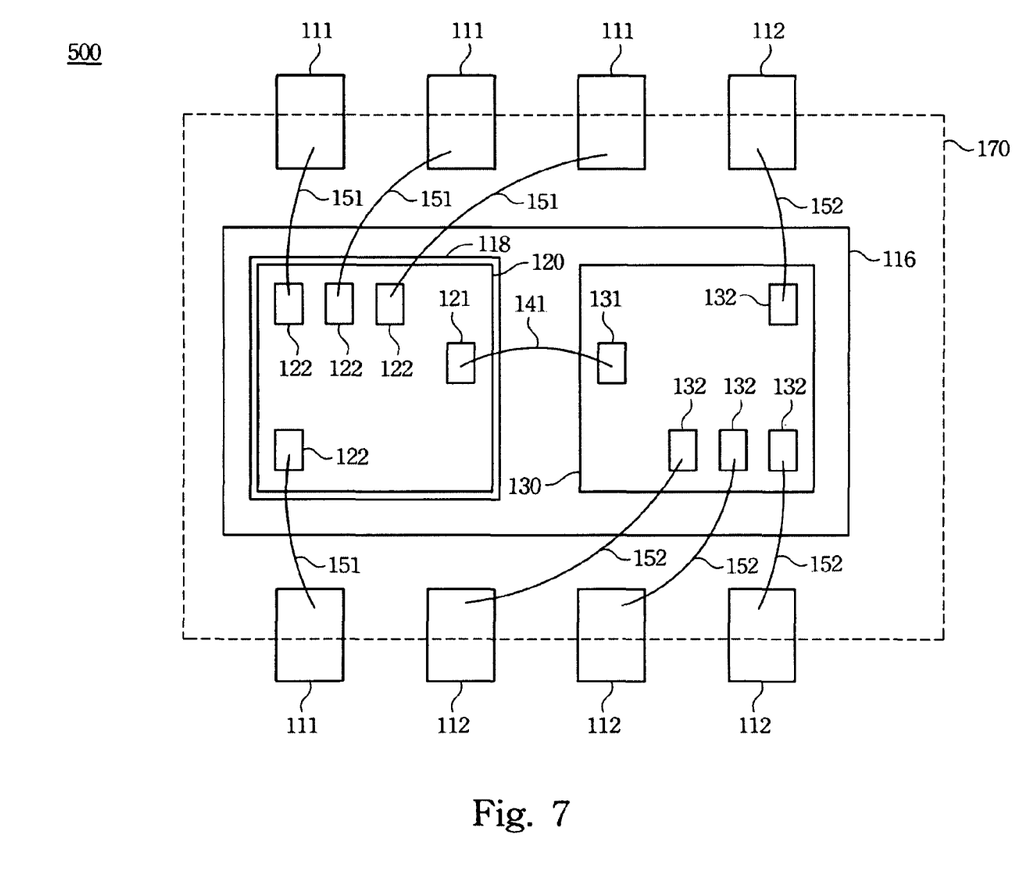
FIG. 7 is a schematic diagram of a package structure according to a fifth embodiment of the present invention.

Please refer to FIG. 7. FIG. 7 is a schematic diagram of a package structure 500 according to a fifth embodiment of the present invention. In FIG. 207, the package structure 500 comprises a first die 120, a second die 130, a lead frame 116, an insulating layer 118 and at least one the conducting wire 141. The formation of the first die 120 and the second die 130 are shown in FIG. 1 and, thus, are not repeated herein. The first die 120 is disposed apart from the second die 130; the lead frame 116 is disposed under the first die 120 and the second die 130. The insulating layer 118 is disposed between the lead frame 116 and the first die 120.

The insulating layer 118 can electrically isolate the first die 120 and the second die 130 in order to prevent the first die 120 and the second die 130 interfere with each other. In processing, the insulating layer 118 is formed on the bottom of the first die 120; alternatively, the insulating layer 118 is formed on the surface of the lead frame 110.

In FIG. 7, the package structure 500 further comprises a first set of pins 111, a second set of pins 112, a first set of conducting wires 151 and a second set of conducting wires 152. The first set of pins 111 and the second set of pins 112 are disposed alongside the lead frame 116. The first set of conducting wires 151 is coupled with the first die 120 and the first set of pins 111; the second set of conducting wires 152 is coupled with the second die 130 and the second set of pins 112.

In FIG. 7, the first die 120 comprises bonding pads 122, and the second die 130 comprises bonding pads 132. Furthermore, one end of each of the first set of conducting wires 151 is electrically connected to the bonding pads 122 of the first die 120, and the other end of each of the first set of conducting wires 151 is electrically connected to the first set of pins 111; one end of each of the second set of conducting wires 152 is electrically connected to the bonding pads 132 of the second die 130, and the other end of each of the second set of conducting wires 152 is electrically connected to the second set of pins 112. Moreover, a dotted line shows the region of the sealing compound 170.

Figure 8:
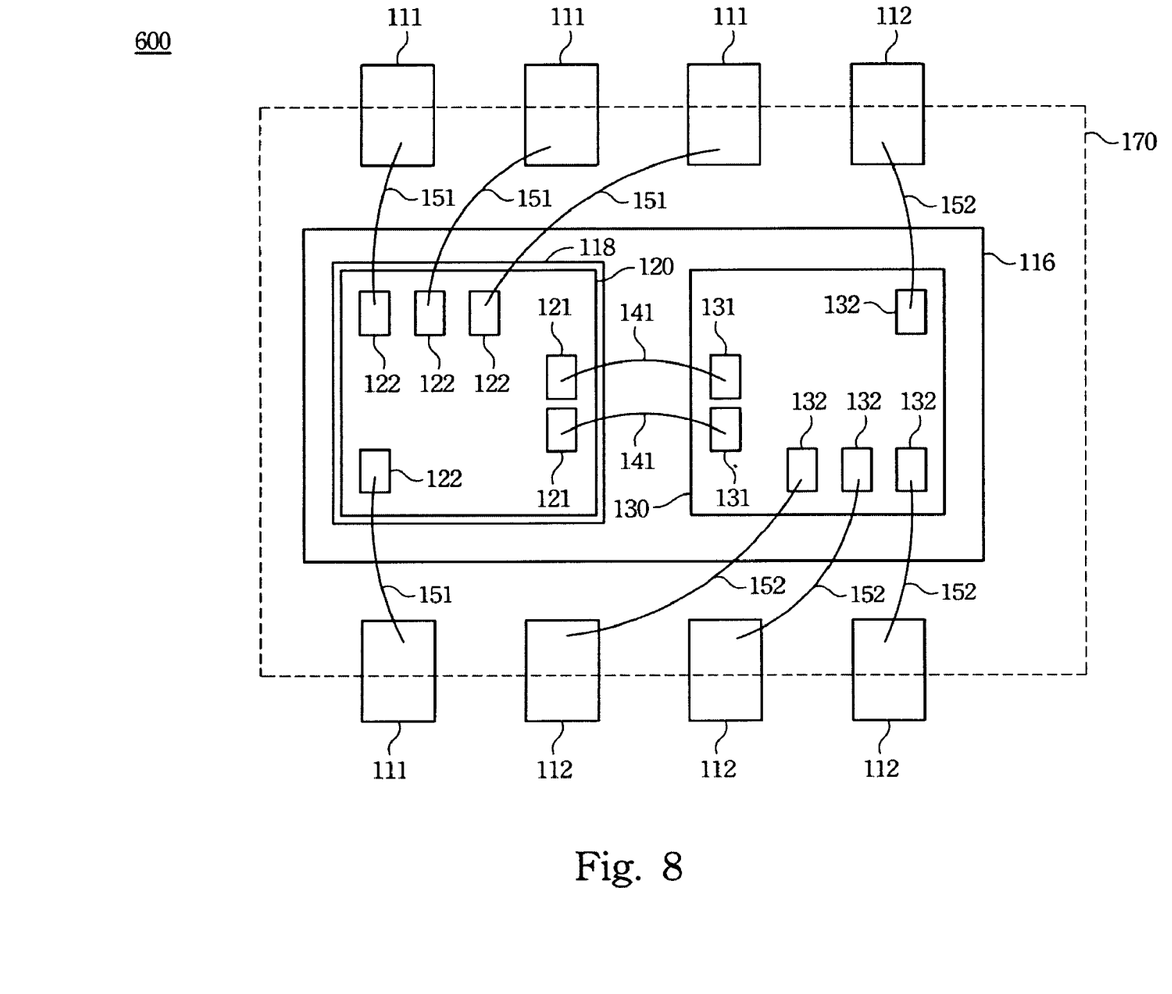
FIG. 8 is a schematic diagram of a package structure according to a sixth embodiment of the present invention.

Please refer to FIG. 8. FIG. 8 is a schematic diagram of a package structure 600 according to a sixth embodiment of the present invention. The package structure 600 is essentially the same as the package structure 500, except that another conducting wire 141 is coupled with the first die 120 and the second die 130 is added.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
    a first lead frame;
    a second lead frame disposed apart from the first lead frame;
    a first die disposed on the first lead frame, wherein the first die comprises:
        a high side driver for a high side switch of a half bridge switch; and
        at least a first bonding pad directly connected to the high side driver;
    a second die disposed on the second lead frame, wherein the second die comprises a low side driver, a high withstand voltage device, a controller coupled with the low side driver and the high withstand voltage device, and at least a second bonding pad directly connected to the high withstand voltage device; and
    at least one conducting wire directly connecting the first bonding pad to the second bonding pad, wherein the high side driver is coupled through the first bonding pad, the conducting wire, the second bonding pad and the high withstand voltage device directly to the controller.

2. The package structure as claimed in claim 1, further comprising:
    a first set of pins disposed alongside the first lead frame; and
    a second set of pins disposed alongside the second lead frame.

3. The package structure as claimed in claim 2, further comprising:
    a first set of conducting wires coupled with the first die and the first set of pins; and
    a second set of conducting wires coupled with the second die and the second set of pins.

4. The package structure as claimed in claim 1, wherein the high withstand voltage device comprises at least one of a high withstand voltage transistor and a high voltage capacitor.

5. A package structure, comprising:
    a first die comprising:
        a high side driver for a high side switch of a half bridge switch; and
        at least a first bonding pad directly connected to the high side driver;
    a second die comprising a low side driver, a high withstand voltage device, a controller coupled with the low side driver and the high withstand voltage device, and at least a second bonding pad directly connected to the high withstand voltage device, wherein the second die is disposed apart from the first die;
    a lead frame disposed under the first die and the second die;
    an insulating layer disposed either between the first die and the lead frame or between the second die and the lead frame; and
    at least one conducting wire directly connecting the first bonding pad to the second bonding pad, wherein the high side driver is coupled through the first bonding pad, the conducting wire, the second bonding pad and the high withstand voltage device directly to the controller.

6. The package structure as claimed in claim 5, further comprising:
    a first set of pins and a second set of pins disposed alongside the lead frame.

7. The package structure as claimed in claim 6, further comprising:
    a first set of conducting wires coupled with the first die and the first set of pins; and
    a second set of conducting wires coupled with the second die and the second set of pins.

8. The package structure as claimed in claim 5, wherein the high withstand voltage device comprises at least one of a high withstand voltage transistor and a high voltage capacitor.

* * * * *